(12) United States Patent
Freeman et al.

(10) Patent No.: US 9,906,213 B2
(45) Date of Patent: Feb. 27, 2018

(54) REDUCING THERMAL RUNAWAY IN INVERTER DEVICES

(71) Applicant: GLOBALFOUNDRIES INC., Grand Cayman (KY)

(72) Inventors: Gregory G. Freeman, Wappingers Falls, NY (US); Siyuranga O. Koswatta, Carmel, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 122 days.

(21) Appl. No.: 14/934,793

(22) Filed: Nov. 6, 2015

(65) Prior Publication Data
US 2017/0133923 A1    May 11, 2017

(51) Int. Cl.
| | |
|---|---|
| *G05F 1/00* | (2006.01) |
| *G05F 1/12* | (2006.01) |
| *G05F 1/648* | (2006.01) |
| *H03K 17/04* | (2006.01) |

(52) U.S. Cl.
CPC .................. *H03K 17/04* (2013.01)

(58) Field of Classification Search
CPC ........... G05F 3/185; G05F 3/24; H02M 3/158
USPC ....... 323/273, 289, 293, 295–298, 349, 350, 323/352–354
See application file for complete search history.

(56) References Cited

U.S. PATENT DOCUMENTS

| | | | | |
|---|---|---|---|---|
| 4,239,989 A | * | 12/1980 | Brajder ............ | H03K 17/04126 323/289 |
| 5,355,028 A | * | 10/1994 | O'Toole .................... | G05F 3/24 326/121 |

(Continued)

FOREIGN PATENT DOCUMENTS

| | | | |
|---|---|---|---|
| EP | 1 765 042 A3 | 3/2007 | |
| WO | WO 2009/029334 A2 | 3/2009 | |

OTHER PUBLICATIONS

Charisoulis et al., "CNT Sensor arrays with P-i-N diodes", InSENSORS, 2013 IEEE, Nov. 3-6, 2013, Baltimore, MD, pp. 1-4.

*Primary Examiner* — Gary Nash
(74) *Attorney, Agent, or Firm* — Scully Scott Murphy and Presser; Frank S. DiGiglio

(57) ABSTRACT

An inverter circuit for reducing runaway current due to applied voltage stress and temperature conditions comprises: first and second field effect transistor (FET) devices of opposite device polarities for driving a connected second stage device having a connected $2^{nd}$ stage first and second FET devices, each $2^{nd}$ stage device having a respective input gate terminal. The first FET and second FET devices have a respective output drive terminal, a first conductive structure connects the first FET output drive terminal to the input gate terminal of each the first and second connected FET device and further connects the first FET output drive terminal to the second FET output drive terminal through a ballasting resistor device. A second separate conductive structure connects the second FET output drive terminal to the input gate terminals and includes a path further connecting the second FET output drive terminal to the first FET output drive terminal through the ballasting resistor device.

20 Claims, 9 Drawing Sheets

(56) References Cited

U.S. PATENT DOCUMENTS

| | | | |
|---|---|---|---|
| 5,751,180 A * | 5/1998 | D'Addeo | H03K 17/08122 |
| | | | 326/27 |
| 5,767,549 A | 6/1998 | Chen et al. | |
| 5,981,982 A | 11/1999 | Driscoll | |
| 6,292,343 B1 | 9/2001 | Pequignot et al. | |
| 6,590,800 B2 | 7/2003 | Chang | |
| 6,753,707 B2 * | 6/2004 | Honda | H03K 5/133 |
| | | | 326/24 |
| 6,927,458 B2 | 8/2005 | Worley | |
| 2004/0160261 A1 | 8/2004 | Koch, II et al. | |
| 2006/0284566 A1 | 12/2006 | Rudolph | |
| 2012/0300349 A1 | 11/2012 | Abou-Khalil et al. | |
| 2013/0258736 A1 | 10/2013 | Higuchi et al. | |

* cited by examiner

| EXAMPLE | 1st-STAGE wRX (um) | 1st-STAGE NUMBER OF FINGERS | 1st-STAGE WEFF (um) | PC WIDTH (um) | PC RESISTANCE (Ohm/sqr) | PC RESISTANCE (Ohm/um) | 2nd-STAGE BALLASTOR LENGTH (um) | 2nd-STAGE BALLASTOR RESISTANCE (Ohms) | NUMBER OF PARRALLEL PC BALLASTORS | EFFECTIVE BALLASTING RESISTANCE (Ohms) | STRESS IKG VALUE (mA/um) | TOTAL 1st-STAGE STRESS Ikg (mA) | ADDITIONAL VOLTAGE MARGIN DUE TO BALLASTING EFFECT (mV) |
|---|---|---|---|---|---|---|---|---|---|---|---|---|---|
| CASE-1 | 0.5 | 10 | 5 | 0.03 | 20 | 666.7 | 0.3 | 200.0 | 4 | 50.0 | 0.1 | 0.50 | 25.0 |
| CASE-1 | 0.5 | 10 | 5 | 0.03 | 20 | 666.7 | 0.3 | 200.0 | 4 | 50.0 | 0.2 | 1.00 | 50.0 |
| CASE-2 | 0.5 | 10 | 5 | 0.03 | 20 | 666.7 | 0.5 | 333.3 | 3 | 111.1 | 0.1 | 0.50 | 55.6 |
| CASE-2 | 0.5 | 10 | 5 | 0.03 | 20 | 666.7 | 0.5 | 333.3 | 3 | 111.1 | 0.2 | 1.00 | 111.1 |
| CASE-3 | 0.5 | 10 | 5 | 0.03 | 20 | 666.7 | 0.7 | 466.7 | 2 | 233.3 | 0.1 | 0.50 | 116.7 |
| CASE-3 | 0.5 | 10 | 5 | 0.03 | 20 | 666.7 | 0.7 | 466.7 | 2 | 233.3 | 0.2 | 1.00 | 233.3 |

FIG. 5

REDUCING THERMAL RUNAWAY IN INVERTER DEVICES

BACKGROUND

The present invention relates generally to transistor devices, and in particular to a novel inverter device and circuit structure that increases resistance at its output stage without effecting performance of the driver inverter.

Semiconductor devices that employ a first stage inverter circuit including, for example, a buffer circuit or a circuit configuration of a NAND or NOR device, are found to be increasingly susceptible to become overstressed during "burn-in" conditions, e.g., during manufacture and test.

That is, typical semiconductor device "burn in" procedures requires acceleration of failure modes by accelerated voltage and temperature conditions applied at the chip level. Under such conditions, some transistor devices such as field effect transistors (FETs) become overstressed due to device self-heating, sometimes resulting in a thermal runaway condition.

FIG. 1A shows a schematic of a conventional inverter circuit 10 comprising a N-type FET (NFET) 15 and p-type FET (PFET) 12 connected at a single driving terminal of each, e.g. a drain terminal 13, and having a common gate connection. This circuit 10 is configured as a driving stage for driving current sourced from the circuit 10 at the single common drain terminal 19 along a single conductor 18 to drive connected next stage circuitry, e.g., inverter stage 20. Further inverter circuitry 20 may be a similarly configured inverter device, however as shown, the driving input conductor 18 is split to provide two conducting paths: a first naturally resistive path 28 for driving a gate of the PFET 22 of circuit 20, and a second naturally resistive path 29 for driving a gate of the NFET 25 of circuit 20. In an implementation, the opposing FET 12, may be on the order of 10 µm-50 µm in width, and capable of supplying >10 mA current supply to opposing FET if that FET is drawing current.

Large multifingered FETs are particularly more susceptible to overstressed conditions due to both high finger density and capability of opposing FET to feed high current to the nominally off-state FET. Thus, for the prior art driving circuit 10 of FIG. 1A, under burn-in conditions, wherein the input voltage, Vg, of each gate at circuit 10 is zero (0 Volts), for example, such that NFET transistor 15 is turned off and an elevated stress voltage, VDD_stress, is applied at 16, the leakage current under VDD_stress will lead to power dissipation in the NFET 15 that is in the off-state via a low resistance supply path indicated at 19. That is, the "on" FET 12 has a low resistance, so negligible voltage drop appears across it, however, the "OFF"-state FET 15 incurs self-heating at the elevated VDD_stress voltage.

Even in an alternate configuration where Vg is applied a VDD_stress voltage thereby turning on the NFET 15, and the VDD is at the VDD_Stress voltage, the PFET device 12 will be at the elevated stress and subject to the heating via the low resistance path 19.

Thus, while a current solution such as shown in FIG. 1B may add a resistance element 24 in the low resistance path at the common terminal 13 in such circuit 10, such a solution may have higher impact on performance, or otherwise are not compatible with providing the isolation required for performance or reduced variability.

It would be highly desirable to provide a device feature and circuit configuration that lessens the susceptibility of such circuits to become overstressed in burn-in conditions, and that limit these overstress runaway outcomes, without significant impact to performance.

BRIEF SUMMARY

In an aspect of the present disclosure, there is provided a semiconductor circuit including FET transistors configured as an Inverter, NAND, or NOR design that lessens the susceptibility of such circuits to become overstressed in burn-in conditions (applied stress voltage or temperature), and limit overstress runaway outcomes, without significant impact to performance.

In one aspect of the present disclosure, there is provided a semiconductor circuit including FET transistors configured as an Inverter, NAND, or NOR design having an n-type FET (NFET) portion of a driving stage connected to the next stage through a separate wiring as the p-type FET (PFET) portion of the same driving stage.

Thus, in a first aspect, there is provided an electronic circuit, the circuit comprising: a first field effect transistor (FET) device of a first device polarity; a second FET device of second device polarity, and a connected second stage device including a connected first FET device having a first input gate terminal and a connected second FET device having a second input gate terminal, the first FET device and second FET device for driving the connected second stage device through a ballasting resistor element physically present within the first input and second input gate terminals of the connected second stage device; the first FET device having an output drive terminal, and the second FET device having an output drive terminal; and a first conductive structure connecting the first FET output drive terminal to the input gate terminal of each the first and second connected FET device and includes a path further connecting the first FET output drive terminal to the second FET output drive terminal through the ballasting resistor element; and a second separate conductive structure connecting the second FET output drive terminal to the input gate terminal of each the first and second connected FET device and includes a path further connecting the second FET output drive terminal to the first FET output drive terminal through the ballasting resistor element.

In a second aspect, there is provided a method of fabricating an electronic circuit. The method comprises: forming a drive stage inverter having first and a second field effect transistor (FET) devices, the first FET device of a first device polarity and the second FET device of second device polarity, forming a second stage device having a formed first FET device and a formed second FET device, each formed first FET device and a formed second FET device having a respective plurality of common input gate terminal structures; forming one or more ballasting resistor structures, each ballasting resistor structure connecting two or more common input gate terminals of the formed second stage first FET device and the second FET device; forming a first conductive structure that connects a first drive stage inverter FET output drive terminal of the first device polarity to one end of each the one or more ballasting resistor structures, the ballasting resistor structure physically present within each of the two or more common input gate terminals of a connected second stage device; and forming a separate a second conductive structure that connects a first drive stage inverter FET output drive terminal of the second device polarity to an opposite end of each of the one or more ballasting resistor structures; wherein the first conductive structure includes a conducting path further connecting the first FET output drive terminal to the second FET output drive terminal through the ballasting resistor device; and the second separate conductive structure includes a conducting path further connecting the second FET output drive terminal to the first FET output drive terminal through the ballasting resistor device.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 4C-1 shows, for the embodiment shown in FIG. 4C, a conductive structure that may include a deposited polysilicon or metal gate material line feature and formed separate contacts to connect the conductive poly or metal gate line to one or more multiple gate finger pairs;

FIG. 5 depicts a chart showing example resultant stress leakage results of formed inverter devices for various first and second stage inverter device characteristics and configurations.

DETAILED DESCRIPTION

Figure 1A:
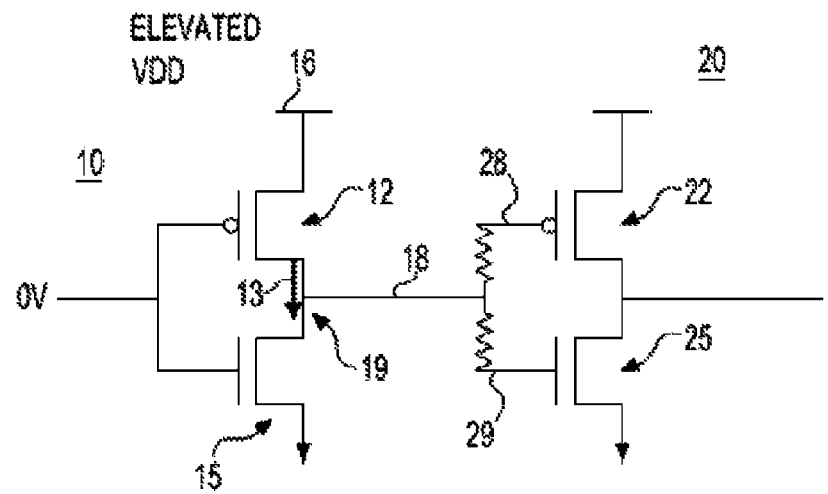
FIG. 1A shows a schematic of a conventional inverter circuit 10 comprising an N-type FET (NFET) and p-type FET (PFET) connected at a single terminal and configured for driving a next inverter device stage.
Figure 1B:
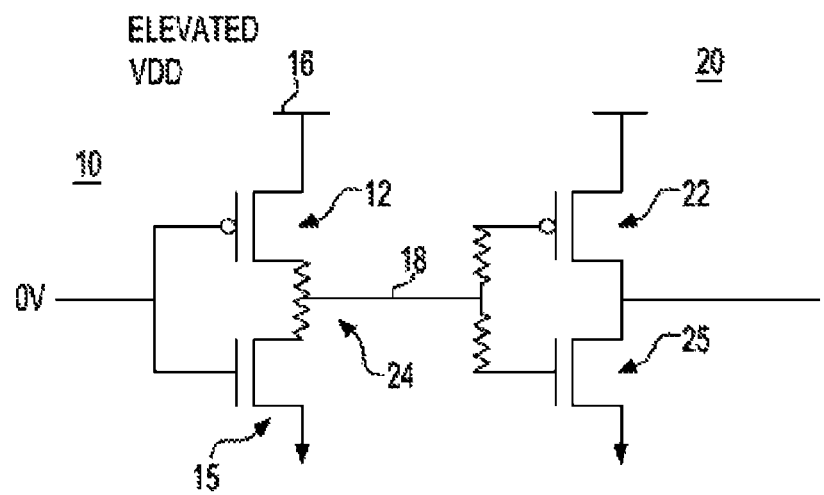
FIG. 1B shows a current solution in which a resistance element is added in the low resistance path in the circuit 10 of FIG. 1.

Aspects of the present disclosure are now described in detail with accompanying figures. It is noted that like reference numerals refer to like elements across different embodiments. The drawings are not necessarily drawn to scale. As used herein, ordinals such as "first," "second," and "third," etc. are employed to distinguish similar elements, and a same element may be labeled with different ordinals across the specification and the claims.

In an aspect of the present disclosure, there is provided a semiconductor circuit including FET transistors configured as an Inverter, Nand, or Nor design that lessens the susceptibility of such circuits to become overstressed.

Figure 2:
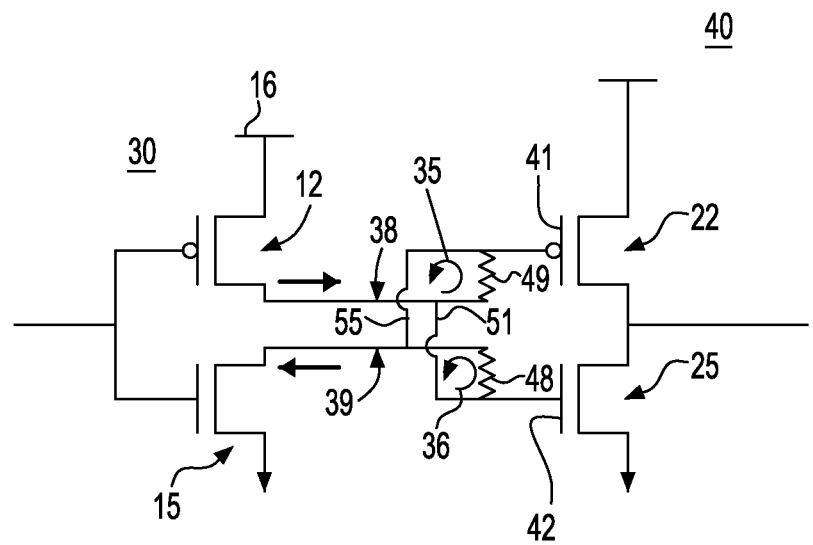
FIG. 2 shows an embodiment of the inverter device having reduced susceptibility to elevated heating by providing individual roundtrip output paths through a next stage gate from each respective transistor of the first stage according to a first embodiment.

As shown in FIG. 2, there is provided a first embodiment of a semiconductor circuit 30 including first drive stage transistors, e.g., configured as an Inverter, a buffer, or a Nand or Nor circuit design, configured to drive a further second device stage 40. In one embodiment, the first drive stage may comprise any device having "pull-up" and "pull-down" segments as used in complementary logic. In the embodiment of FIG. 2, however, the n-type FET (NFET) device portion 15 of the driving stage 30 is connected to the further second device stage through a separate wiring path 38 as the p-type FET (PFET) portion of the same driving stage; and the p-type FET (PFET) device portion 12 of the driving stage 30 is connected to the further second device stage through a separate wiring path 39 as the n-type FET (NFET) portion of the same driving stage. In one embodiment, the second drive stage device may also comprise an inverter device, or any device having "pull-up" and "pull-down" segments as used in complementary logic. For non-limiting purposes of illustration, the second driven stage device is referred to as an inverter device.

As shown in FIG. 2, the drain terminal of each FET device 12, 15 are not shorted together as in prior art design. That is, in the circuit 30 of FIG. 2, the naturally present (i.e., intrinsic) gate resistance of the next (e.g., $2^{nd}$) stage device 40 is used to add a resistive path for round-trip through the next stage gate. Thus, in the first driving stage, there is an increased direct current resistance path 35 from Vdd to ground that connects to the resistance (gate finger) of the next stage device.

Thus, for example, in view of FIG. 2, separate paths 38, 39 are formed at the output of each respective transistor 12, 15 of driving circuit 30 that each connect with a respective gate at the device inputs of the driven second stage 40. As shown in FIG. 2, a first conductive path 38 is provided at the output terminal of device 12 that connects to the input gate terminal 42 of NFET 25 of next stage 40 via a first conductive leg 51. A further conductive path 39 is provided at the output of device 15 that connects to the input gate terminal 41 of PFET 22 of next stage 40 via a second conductive leg 55.

Moreover, first conductive path 38 provided at the output of device 12 further connects to the input gate terminal 41 of PFET 22 of next stage 40 in the configuration shown in FIG. 2. Here, first conductive path 38 includes one end that connects back to the second conductive leg 55 and output conductive path 39 along a resistive leakage path 35 that includes a natural resistance (depicted as a resistor element) 49 at the input of the gate terminal 41 of next stage PFET device 22.

Moreover, second conductive path 39 provided at the output of device 15 further connects to the input gate terminal 42 of NFET 25 of next stage 40 in the configuration shown in FIG. 2. Here, second conductive path 39 includes one end that connects back to the conductive leg 51 and to output conductive path 38 along a resistive leakage path 36 that includes a natural resistance (depicted as a resistor element) 48 at the input of the gate terminal 42 of next stage FET device 25.

That is, wiring from the driving inverter (or, alternately, a NAND or NOR gate) to the next stage or load of a circuit is separate for P side and N side of the inverter. Each of the separate wires may separately contact the gate of the next stage transistors. However, the path from NFET to PFET of the driving inverter is increased, adding resistance to the N to P path, but not adding significant resistance from the driving inverter to next stage gate. This N to P resistance provides a limit to high current running from N to P within the driving inverter, and thus limits the heating of the devices in that inverter.

Thus, as shown in FIG. 2, the inclusion and use of "ballasting" resistors 49, 48, i.e., natural resistances at respective gate input terminals 42, 41 of the next inverter stage in respective leakage paths 35, 36 that conduct current to/back from respective separate wiring outputs 39, 38 of each respective FET 15, 12 of the driving inverter stage 30, impacts minimally on circuit performance such that the abrupt leakage increase and thermal runaway can be pushed to higher voltages. This will protect the worse-case circuits from thermal runaway and overstress during burn-in.

Here a series resistance 48, 49 is provided to provide "ballast" at each respective output of each respective PFET and NFET of the driving stage 30 with minimal device performance impact. In one embodiment, the circuit configuration can add up to and about 50-1000 Ohms without impacting performance.

Figure 3:
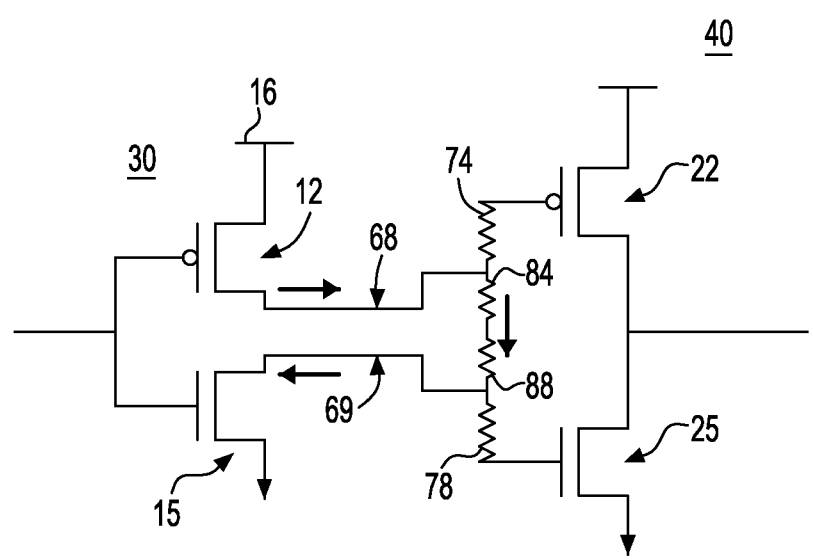
FIG. 3 shows an embodiment of the inverter device having reduced susceptibility to elevated heating by providing individual roundtrip output paths through a next stage gate from each respective transistor of the first stage according to a second embodiment.

FIG. 3 depicts a further embodiment of a semiconductor circuit 30 including FET transistors configured as an Inverter, Nand, or Nor design configured to drive a further or next inverter stage 40. In the embodiment of FIG. 3, the n-type FET (NFET) device portion 15 of the driving stage 30 is connected to the next stage through a separate wiring path 68 as the p-type FET (PFET) portion of the same driving stage; and the p-type FET (PFET) device portion 12 of the driving stage 30 is connected to the next stage through a separate wiring path 69 as the n-type FET (NFET) portion of the same driving stage. That is, in the circuit 30 of FIG. 3, the naturally present gate resistance of the next (e.g., $2^{nd}$) stage inverter 40 is used to add a resistive path for conduction through the next stage gate.

Thus, for example, in view of FIG. 3, separate paths 68, 69 are formed at the output of each respective transistor 12, 15 of driving circuit 30 that each connect with a respective gate at the inverter device input of the driven next stage 40. As shown in FIG. 3, a first conductive path 68 is provided at the output terminal of device 12 that connects to the input gate terminal 42 of NFET 25 of next stage 40 via a first conductive leg including an added resistive path formed of naturally present gate resistances (of gates 41, 42) depicted as resistor elements 84, 88 and 78. A further conductive path 69 is provided at the output of device 15 that connects to the input gate terminal 41 of PFET 22 of next stage 40 via a second conductive leg including an added resistive path formed of naturally present gate resistances (of gates 41, 42) depicted as resistor elements 84, 88 and 74.

Moreover, first conductive path 68 provided at the output terminal of device 12 further connects to the input gate terminal 41 of PFET 22 of next stage 40 in the configuration shown in FIG. 3. Here, first conductive path 68 includes one end that connects to the second conductive path 69 along a resistive leakage path that includes a natural resistance (depicted as a resistor elements) 84, 88, and further connects to the input of the gate terminal 41 of next stage PFET device 22 along a resistive leakage path that includes a natural resistance (depicted as a resistor element) 74. Here electrical resistance paths depicted as resistances 74, 84 are present at the input to PFET gate terminal 22.

Moreover, second conductive path 69 provided at the output terminal of device 15 further connects to the input gate terminal 42 of NFET 25 of next stage 40 in the configuration shown in FIG. 3. Here, second conductive path 69 includes one end that connects to the first conductive path 69 along a resistive leakage path that includes the same natural resistance (depicted as a resistor elements) 84, 88 and further connects to the input of the gate terminal 42 of next stage NFET device 25 along a resistive leakage path that includes a natural resistance (depicted as a resistor element) 78. Here electrical resistance paths depicted as resistances 78, 88 are present at the input to NFET gate terminal 22.

Thus, in the second embodiment, use is made of the naturally present gate resistance of the $2^{nd}$ stage to add a resistive path (e.g., resistors 84, 88) for round-trip through next stage gate. In one embodiment, there may be added 50-1000 Ohms without impacting performance.

In an exemplary embodiment, a method 100 of forming an inverter circuit driving stage adding ballasting resistors using the natural resistance available at the input of the gate being driven in the manner as shown in FIG. 2 or 3, is now shown as a top down layout views of FIGS. 4A-4F. Here FIGS. 4A-4F show a series of top down layout views resulting from the method 100 of forming the multi-gate FETs with added resistance paths. It is noted that, in FIGS. 4A-4F only the relevant structural elements are shown. Other structures, such as source/drain metal straps in the $2^{nd}$ stage, power rails, etc., have not been shown.

Figure 4A:
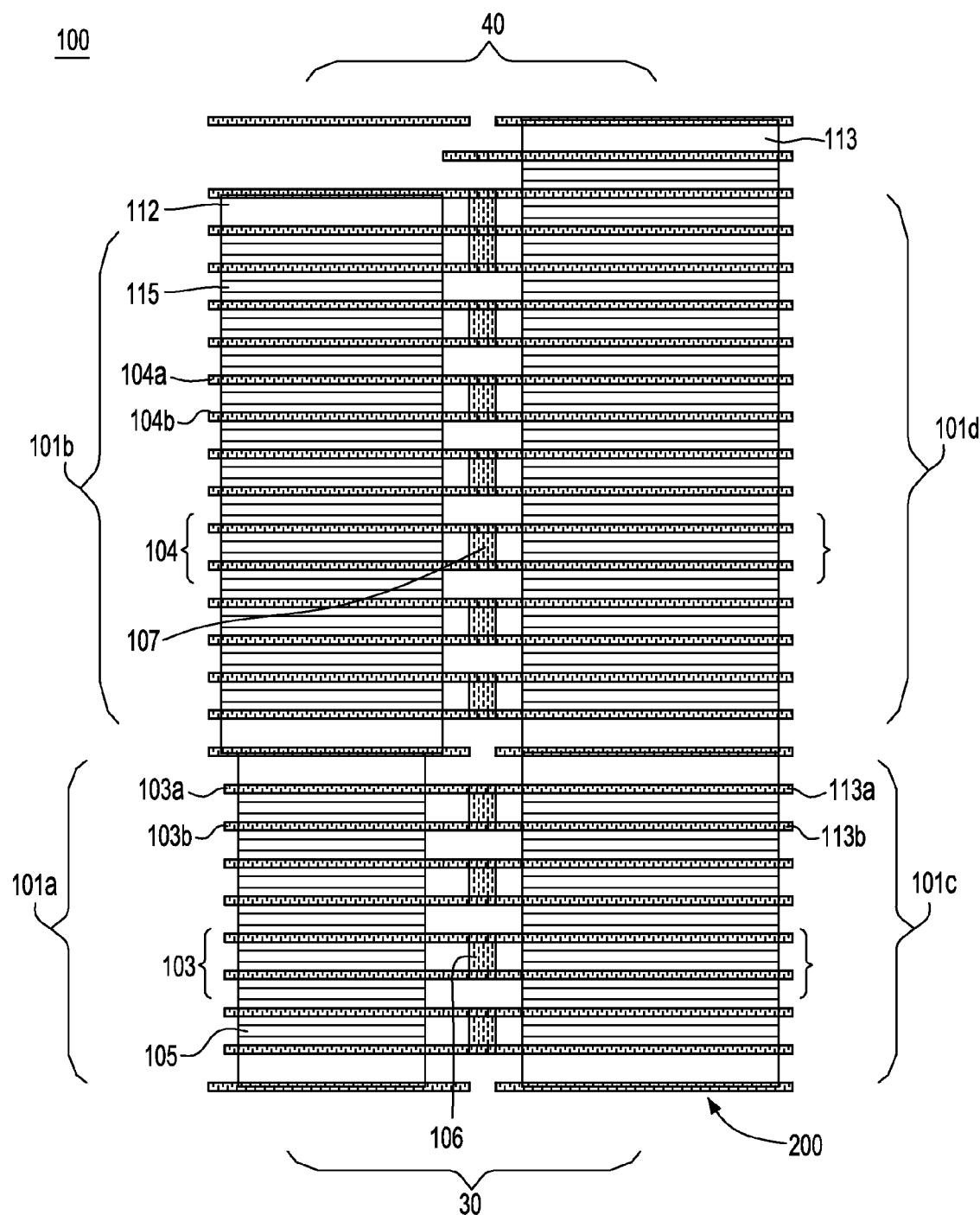
FIG. 4A shows a method step for forming the inverter device embodiment of FIGS. 2 and 3 including providing a drive inverter stage and connected second inverter stage.

In FIG. 4A, an initial layout 200 shows gate conductors (e.g., a poly-Si, or a metal-gate material), and active channel regions for four FETs, with two FETs being multi-fingered gate NFETs 101a, 101b and two multi-fingered gate PFETs 101c, 101d.

In the embodiment depicted, each FET 101a, 101b, 101c, 101d is configured with multiple gate fingers shown on active device regions with multi-fingered gate FET devices shown on active region 112 being NFET devices 101a, 101b, and multi-fingered gate FET devices 101c, 101d shown on active region 113 being PFET devices.

Further, in the layout 200 of FIG. 4A, bottom FETs 101a, 101c are the drive stage FETs with multi-fingered FET 101a corresponding to NFET 15 and with multi-fingered PFET 101c corresponding to PFET 12 of the circuit stage 30 of FIG. 2. In a non-limiting example, each device 101a, 101c includes eight (8) parallel fingers (a polysilicon conductor material or a metal gate such as a metal, e.g., a tungsten metal gate, or TiN metal gate, or TiN/tungsten combined stack as a metal gate, or a metal silicide, for example) shown connected as four pairs 103 of two fingers each. Here, two polysilicon or metal silicide gate fingers 103 are connected at gate electrode feature 106. Similarly, in the layout example, top FETs 101b, 101d are the next inverter stage FETs with multi-fingered FET 101b corresponding to NFET 25 and with multi-fingered FET 101d corresponding to PFET 22 of the circuit stage 40 of FIG. 2. In a non-limiting example, each device 101b, 101d includes about sixteen (16) parallel fingers (metal gate or polysilicon conductors) shown connected as eight pairs 104 of two connected fingers. Here, two polysilicon or metal gate fingers 104 are strapped (connected) by gate conductor (poly or metal gate) structure 107.

As will be described, in the embodiment of the layout 200 of FIG. 4A, the number of fingers of each drive stage and next stage multi-gate FETs is a design choice, and are not necessarily limited to 8 or 16 fingers.

Further, in the embodiment of the layout 200 of FIG. 4A, each bottom drive stage FETs 101a, 101c include parallel polysilicon and/or metal conductor gate fingers (or pairs 103 thereof) that are common to both devices drive stage NFET/PFET as shown by the parallel polysilicon or metal gate terminals 103a, 103b, for example, common to both the NFET 101a and PFET 101c. Likewise, each top next stage FETs 101b, 101d include polysilicon or metal conductor gate fingers (or pairs 104 thereof) that are common to both devices next stage NFET/PFET as shown by the parallel polysilicon or metal gate conductor terminals 104a, 104b, for example, common to both the NFET 101b and PFET 101d.

Further, in the embodiment of the layout 200 of FIG. 4A, each bottom drive stage FETs 101a, 101c include an active layer, e.g., shared drain terminals 105 between each adjacent polysilicon or metal gate conductor finger. Likewise, each top next stage FETs 101b, 101d include an active channel layer, e.g., drain terminals 115 between each adjacent polysilicon or metal gate conductor finger.

Figure 4B:
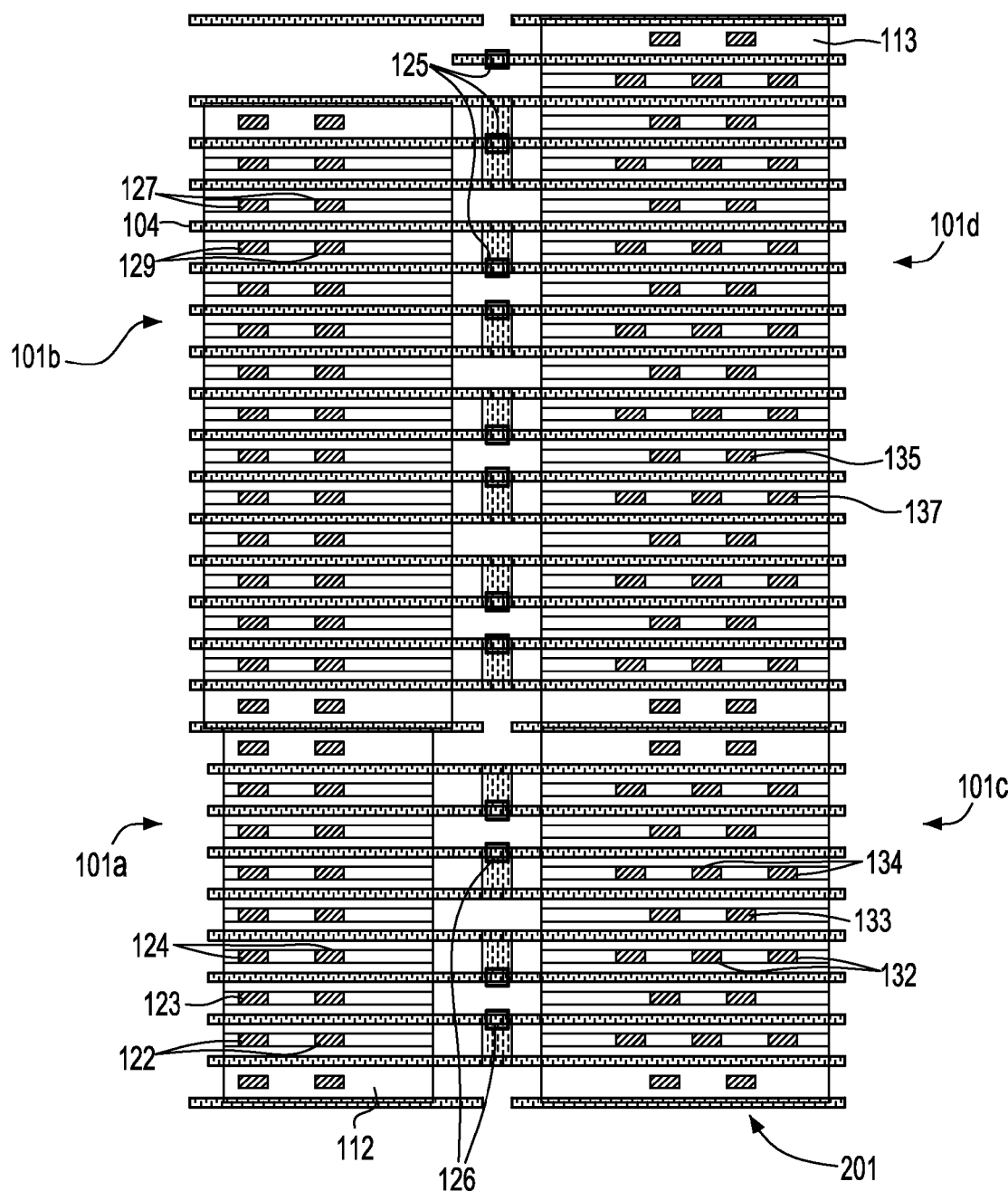
FIG. 4B shows a further method step for forming the inverter device embodiment of FIGS. 2 and 3 including the forming of contacts for terminal structures of the drive inverter stage and connected second inverter stage.

In FIG. 4B, there is shown a further top view layout 201 depicting a result of further semiconductor manufacturing process steps applied to the structures formed in layout 200 of FIG. 4A for forming physical contacts for each gate, drain and source regions of each of the four multi-fingered gate FETs 101a, 101c, 101c and 101d. For example, resulting from the semiconductor lithographic processing, drive NFET device 101a is shown having formed drain terminals 122 and drain terminals 124 formed at one side of each gate finger, while contacts 123 may correspond to FET device finger source terminals at the other side of each gate finger. Likewise, corresponding drive PFET device 101c is shown having formed drain terminals 132 and drain contacts 134 at one side of each gate finger, while contacts 133 may correspond to FET device source terminals at the other side of each gate finger. Further, a gate terminal contact 126 for the drive stage NFET 101a and PFET 101c gate polysilicon or metal gate layers are formed at each common region 106 where each gate poly or metal finger of a pair of fingers are connected.

Likewise, resulting from the semiconductor lithographic processing, next stage NFET device 101b is shown having formed drain terminal contacts 127 at one side of each gate finger, while contacts 129 may correspond to FET device source terminals at the other side of each gate finger 104; likewise, corresponding next stage PFET device 101d is shown having formed drain terminal contacts 137 corresponding to a gate fingers, while contacts 135 may correspond to FET device source terminals at the other side of each gate finger. Further, a gate terminal contact 125 for the next stage NFET 101b and PFET 101d gate polysilicon or metal gate material layers are formed at each common region 107 where each gate poly finger or metal gate finger of a pair of fingers are connected.

Figure 4C:
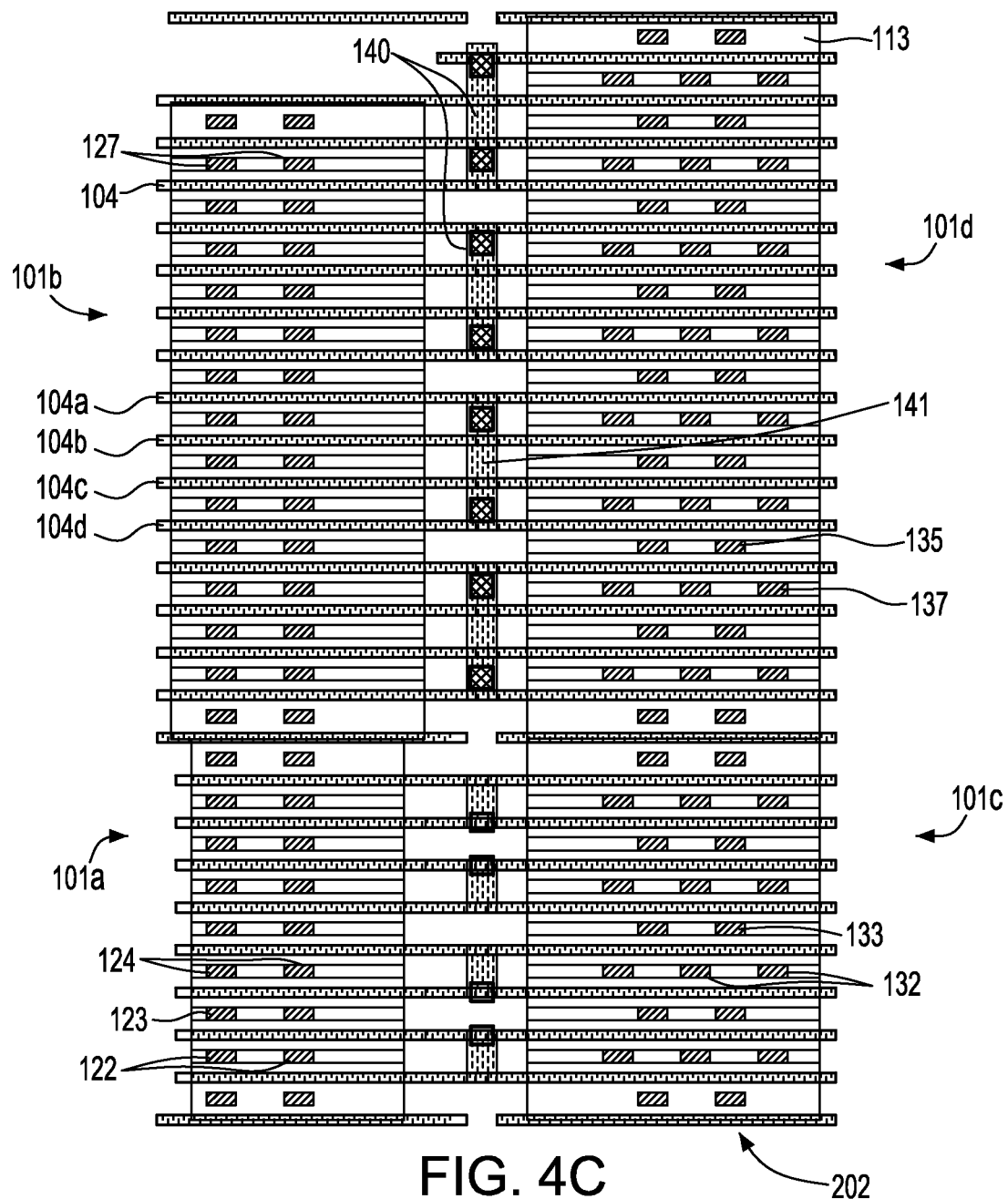
FIG. 4C shows a further method step for forming the inverter device embodiment of FIGS. 2 and 3 including the forming of ballasting resistor element including plural ballasting resistor segments according to one embodiment.
Figures 1, 4C:
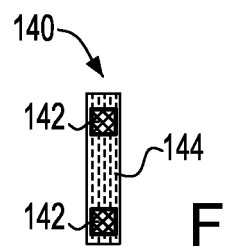

In FIG. 4C, there is shown a further top view layout 202 depicting a result of a subsequent semiconductor manufacturing process step applied to the structures 201 of FIG. 4B including the forming of parallel resistive structures, e.g., polysilicon or metal gate line structures 140. These additional structures 140 provide the ballasting resistance in paths that connect to each gate of the formed second stage FETs 101b and 101d, and may be formed at the same time as the rest of gate patterning. As shown in FIG. 4C-1, each conductive structure 140 may include a deposited polysilicon or metal gate material (e.g., metal silicide) line feature 144, including formed separate contacts 142 to connect the conductive poly or metal gate line 144 to one or more multiple gate finger pairs, e.g., a connected pair of separate parallel fingers 104a, 104b and a second connected pair of separate parallel fingers 104c, 104d. That is, in the embodiment depicted in FIG. 4C, poly-Si segment 144 instead connects 4 gate fingers, 104a thru 104d.

For example, in FIG. 4C, one of the conductive poly or metal gate line structures 141 is shown connecting gate contacts 125 spanning the multiple gate fingers 104a-104d common to both NFET 101b and PFET 101d. Each of these structures 140 provide the added intrinsic polysilicon or metal gate material resistance for the second stage inverter.

As further shown in FIG. 4C, the added number of polysilicon or metal gate resistive structures 140 providing the ballasting resistance in paths that connect to each of the multiple parallel gates of the formed second stage FETs 101b and 101d may be segmented according to the number of the parallel formed gate polysilicon or metal gate lines 104 common to both second stage inverter NFET and PFET devices. For example, in the non-limiting embodiment depicted in FIGS. 4A-4E, there are shown four (4) ballasting resistance structures 140 that connect a span of the sixteen (16) parallel fingers (the next stage input gate polysilicon or metal gate conductors 104 shown connected as eight pairs of two connected fingers 104 each). In this configuration, there are 4 ballast resistors, each connecting 4 fingers with the drain terminal of the drive NFET and PFET separately connecting each segment of parallel poly lines of the second stage inverter.

Figure 4D:
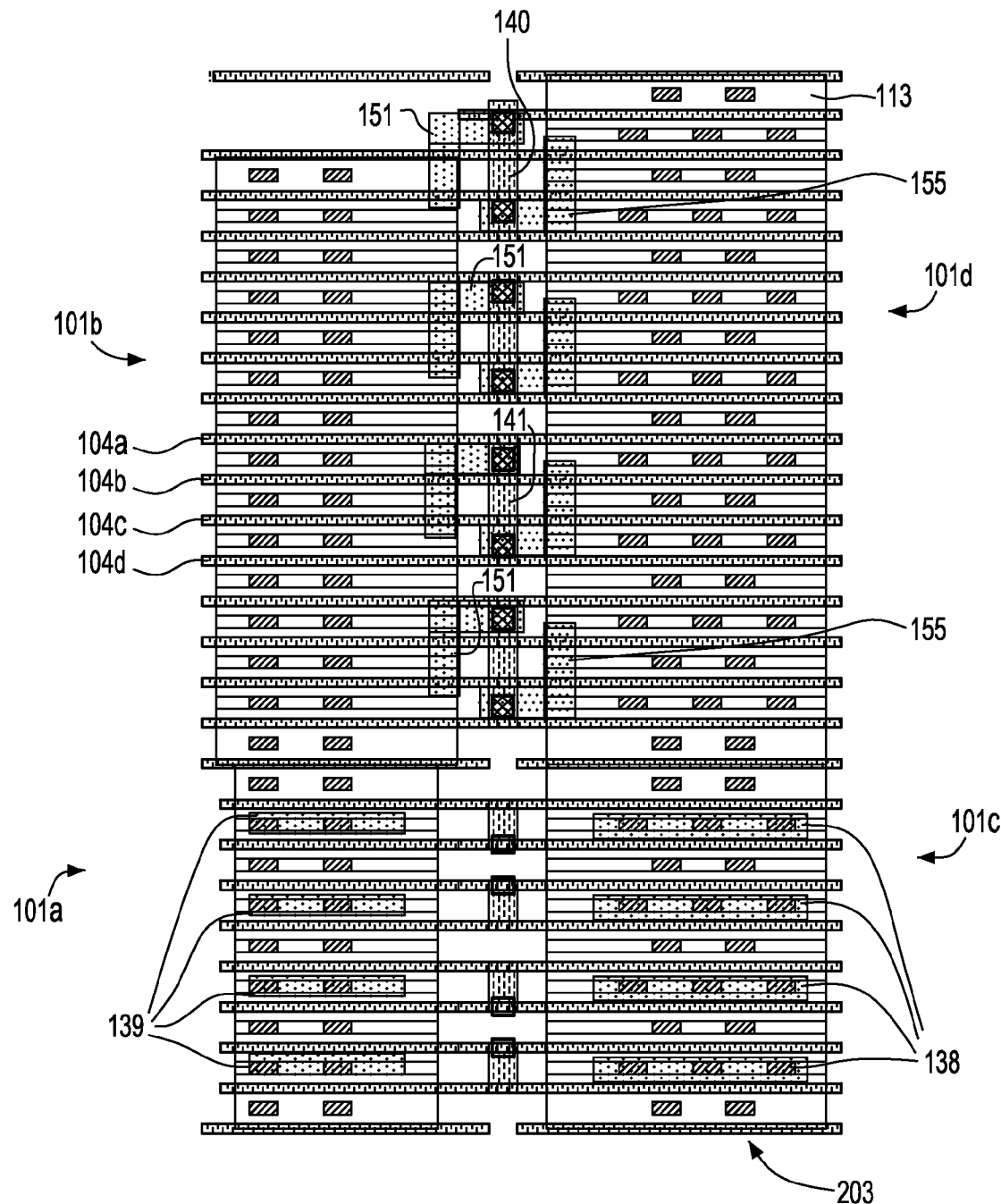
FIG. 4D shows a further method step for forming metal level structures connecting plural output drive terminals of the drive stage inverter device of first device polarity, and forming metal level structures connecting plural output drive terminals of the drive stage inverter device of second device polarity.

In FIG. 4D, there is shown a further top view layout 203 depicting a result of subsequent semiconductor manufacturing process steps applied to the structures 202 of FIG. 4C for forming upper level, e.g., "M1" metal layer, metal material connections 151, 155 providing the additional wiring paths at the gates (gate fingers) of the next stage inverter NFET 101b and PFET 101d that eventually connect to the output drain terminals of the driving stage FETs 101a, 101c. For instance, each respective formed metal line 151 at the NFET 101b is shown connecting to a respective one end of a corresponding formed poly or metal gate line feature 140 and a respective formed metal line 155 at the PFET 101d is shown connecting to a respective opposite end of a corresponding formed poly or metal gate line feature 140. Further shown are formed M1 metal level metal material structures, e.g. shared drain wires 139. Each conductive metal line structure 139 is formed to connect together each of the shared drain terminal contacts associated with a respective gate finger of the drive stage NFET 101a. Similarly shown in FIG. 4D are formed upper layer metal level metal structures 138, e.g., shared drain structures. Each conductive metal line structure 138 is formed to connect together each of the drain terminal contacts associated with a respective gate finger of the drive stage PFET 101c. Each of the metal formed metal layer lines 138, 139, 151, 155 may be a metal material such as copper, gold, cobalt, tungsten or aluminum.

Figure 4E:
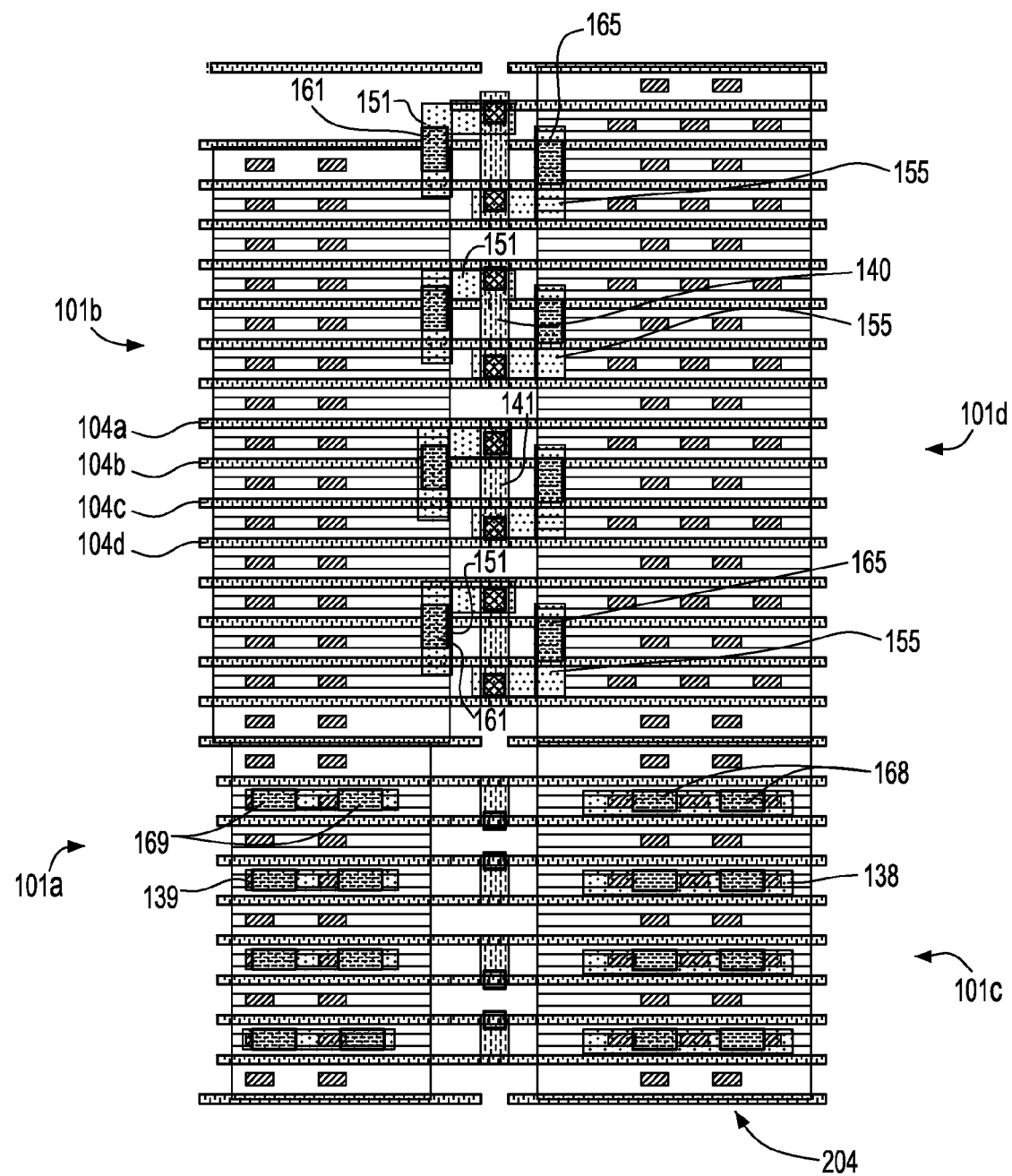
FIG. 4E shows a further method step for forming the inverter device embodiment of FIGS. 2 and 3 including the forming of vias on the formed metal level structures of FIG. 4D.

In FIG. 4E, there is shown a further top view layout 204 depicting a result of subsequent semiconductor manufacturing process steps applied to the structures 203 of FIG. 4D for forming conductive, e.g., metal, via structures 161 on each formed metal line 151 at the NFET 101b, and further forming conductive via structure 165 on each formed metal line 155 at the PFET 101d. Further shown are formed two conductive metal via structures 169 formed on each respective metal line 139 at the drive stage NFET 101a. Further shown are formed two conductive metal via structures 168 formed on each respective metal line 138 at the drive stage PFET 101c.

Figure 4F:
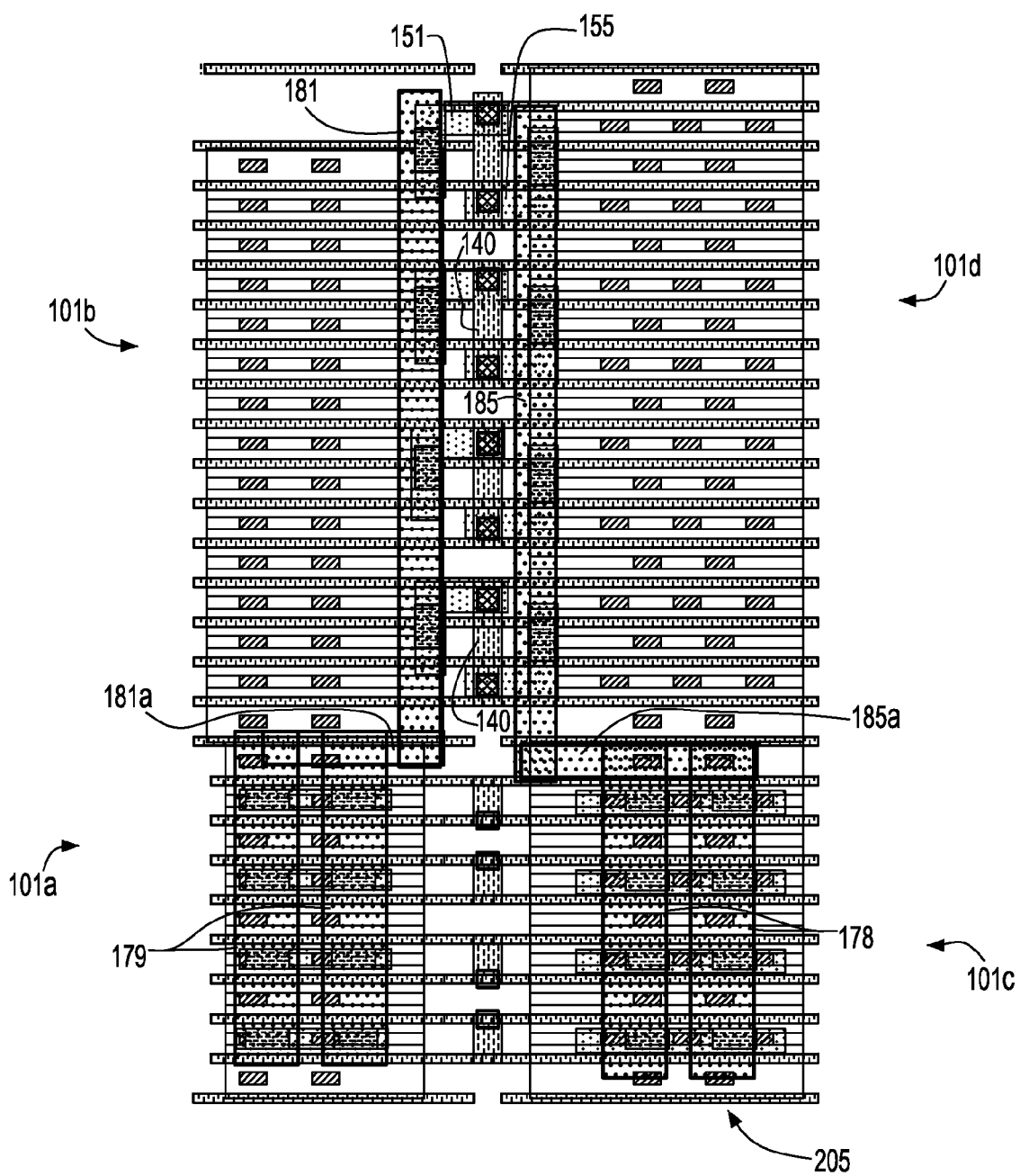
FIG. 4F shows a further method step for forming further metal level structures connecting the output drive terminals of the drive stage inverter device of first device polarity to one end of each ballasting resistor segment at the formed vias, and connecting the output drive terminals of the drive stage inverter device of second device polarity to an opposite end of each ballasting resistor segment at the formed vias.

FIG. 4F shows a further top view layout 205 depicting a result of subsequent semiconductor manufacturing process steps applied to the structures 204 of FIG. 4E for forming a further upper metal level, e.g., M2 layer, of metal lines coupled to each of the underlying formed vias. For example, a second metal level line 181 couples to each of the conductive vias 161 formed on metal lines 151 at the NFET 101b, and second metal level line 185 is formed that couples to each of the conductive vias 165 formed on metal lines 155 at the PFET 101d. Similarly, additional second metal level lines 179 are formed that couples to each of the conductive vias 169 formed on metal lines 139 at the drive NFET 101a, and further second metal level lines 178 are formed that couple to each of the conductive vias 168 formed on metal lines 138 at the drive stage PFET 101c. A short metal line extension 181a is formed for conductive coupling to each of the formed metal lines 179 of the drive stage NFET 101a to the gate metal line 181 of the NFET 101b. Similarly, a short metal line extension 185a is formed for conductive coupling to each of the formed metal lines 178 of the drive stage PFET 101c to the gate metal line 185 of the next stage PFET 101d.

In the method steps 100 depicted in FIGS. 4A to 4F, there is formed respective drive stage NFET and PFET including a drain terminal (e.g., connected drains of multi-finger FET devices) that each has a separate wires connection to the gate terminals of the next stage FETs, with drain terminal of drive stage NFET 101a connecting to the NFET gate of the next stage NFET 101b via conductive lines.

Thus, as shown in FIG. 4F, the separate drive stage output connection wire 178 of drive transistor PFET 101c separately contacts each respective gate of each respective next stage FET transistor gates: one path to PFET gate through wires 178, 185a, 185, and a second path to NFET gate through wires 178, 185a, 185 and additional wires 155 and 151 through the bottom portion of ballasting resistor 140 (polysilicon layer). Similarly, drive stage output connection wire 179 of drive transistor PFET 101a separately contact a respective gate of the next stage transistor FET transistor gates: one path to the NFET through conductive paths including wires 179, 181a, 181, and a second path to the PFET gate through wires 179, 181a, 181 and additional wires 155 and 151 through the top portion of ballasting resistor 140.

In this embodiment, with minimal device impact, the length of the path from next stage NFET 101b to PFET 101c of the driving inverter is increased, adding resistance to the NFET to PFET drive path, but not adding significant resistance from the driving inverter to next stage gate. In one embodiment, the amount of resistance presented in the drive path is configurable. For example, changing the number of parallel segments based on the number of fingers in the next stage, will alter the resistance, e.g., the more segments increase the resistance. Alternatively, the length of the poly line or metal gate ballasting resistor segment may be modified to achieve a certain resistance value, e.g., increasing the length increases the effective resistance.

Referring to FIG. 5, there is shown a chart 200 comparing various example drive stage and next ($2^{nd}$) stage inverter devices having different effective added ballasting resistance values. As shown in table 200, for each of three example cases, the effective added ballasting resistance is dependent upon the configuration and characteristics of the transistor's FET drive stages and 2nd stages. For each of the example cases indicated, the various first stage drive FET device configuration and characteristics include, but are not limited to: a first stage drive FET finger width 203 (e.g., in micrometers), the number of fingers in the first stage drive FET 206, the effective first drive stage FET width 209 (which is the individual finger width multiplied by the number of fingers in the drive stage), the sheet resistance 215 of the polysilicon gate or metal gate fin (in ohms per unit sqr), and the resistance 218 of the polysilicon gate or metal gate fin (in ohms/unit length). For each of the example cases indicated, the $2^{nd}$ stage FET device configuration and characteristics include, but are not limited to: the polysilicon ballastor resistor length 221, e.g., in micrometers, the resulting effective ballastor resistor resistance 224 (in ohms) which is obtained as a result of multiplying the resistance of the polysilicon gate fin (in ohms/unit length) at column 218 with the polysilicon ballastor resistor length of column 221 total and represents the resistance of the path from drive stage FET output terminal to second stage FET input terminal, and the number of poly ballastor resistors 227 (segments). For each of these design case parameters and corresponding values, the resulting effective resistances 230 (in ohms) are shown as the resultant stress leakage value 233, e.g., at VDD_STRESS (e.g., in milliamps per unit width of the driver stage), the resultant total first drive stage stress leakage value 236 (e.g., in milliamps), and finally shows the additional benefit, e.g., in the form of a voltage margin 239 due to the series connected ballasting effect. Here, the total first drive stage stress leakage value 236 is a product of the first drive stage FET width value 209 and the stress leakage value 233. Additionally, the voltage margin 239 is a product of the effective resistances 230 and the total first drive stage stress leakage value 236. For example, given the effective first drive stage FET width (in micrometers) and the stress leakage value (mA/μm) gives the stress leakage current (mA) which now flows through an effective ballastor resistance (e.g., 50 ohms) thus yielding a corresponding voltage margin benefit for the static DC case without significantly impacting alternating current circuit performance.

Thus, when VDD_STRESS is applied, and if the leakage 13 in the driver stage is too high (current 13 in FIG. 1A), part of the stress voltage will be dropped across the ballasting resistor instead of the drive FET, thus protecting the FET from self-heating and thermal runaway.

This adding resistance to the NFET to PFET path provides a limit to high current running from the NFET transistor to PFET transistor path within the driving inverter, and thus limits the heating of the devices in that inverter.

While the embodiments described herein implement a NAND type Inverter logic design, it is understood that the embodiments herein could be likewise implemented using inverter device stages of NOR-type logic design wherein NFET portion of a driving stage is connected to the next stage through a separate wiring as the PFET portion of the same driving stage.

Moreover, the structures and methods described may be implemented with other device geometries and layouts and node sizes, e.g., 22 nm or 14 nm size gate nodes and gate conductor materials, e.g., poly-Si or metal gate.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electronic circuit comprising:
   a first field effect transistor (FET) device of a first device polarity;
   a second FET device of second device polarity, and
   a connected second stage device including a connected first FET device having a first input gate terminal and a connected second FET device having a second input gate terminal, the first FET device and second FET device configured to drive the connected second stage device through a ballasting resistor element physically present within the first input and second input gate terminals of the connected second stage device;
   the first FET device having an output drive terminal, and the second FET device having an output drive terminal; and
   a first conductive structure connecting the first FET output drive terminal to the input gate terminal of each the first and second connected FET device and including a first path further connecting the first FET output drive terminal to the second FET output drive terminal through the ballasting resistor element; and
   a second conductive structure connecting the second FET output drive terminal to the input gate terminal of each the first and second connected FET device and including a second path, separate from the first path, further connecting the second FET output drive terminal to the first FET output drive terminal through the ballasting resistor element.

2. The electronic circuit of claim 1, wherein the first and second FET devices form a first inverter drive stage, each output drive terminal of the first FET device and second FET device is an FET device drain terminal.

3. The electronic circuit of claim 2, wherein the first and second FET devices forming the first inverter drive stage is a multi-fingered gate FET device having multiple parallel FET structures.

4. The electronic circuit of claim 3, wherein the first conductive structure further includes a conducting path electrically connecting each output drive terminal of a respective parallel FET structure of the multi-fingered gate first FET device to the input gate terminals, and the second conductive structure further includes a conducting path electrically connecting each output drive terminal of a respective parallel FET structure of the multi-fingered gate second FET device to the input gate terminals.

5. The electronic circuit of claim 1, wherein the first connected and second connected FET devices form a second inverter device.

6. The electronic circuit of claim 5, wherein each the first connected and second connected FET devices forming the second inverter device is a multi-fingered gate FET device having multiple parallel FET structures.

7. The electronic circuit of claim 6, wherein each the first connected and second connected FET device of the multiple parallel FET structures is segmented into a plural sub-sets of parallel connected multi-gate fingers, wherein a ballasting resistor element comprises:
   a plural of parallel connected ballasting resistor structures, each ballasting resistor structure associated with a corresponding one of the plural sub-sets of parallel connected multi-gate fingers, wherein a ballasting resistor structure conductively couples a corresponding plurality of multi-fingered gate inputs of a multiple parallel FET structures segment.

8. The electronic circuit of claim 7, wherein the first conductive structure includes conductive paths connecting the first FET output drive terminal to a respective first contact portion of each respective ballasting resistor structure of the plural parallel connected ballasting resistor structures, and the second conductive structure includes conductive paths connecting the second FET output drive terminal to a respective second contact portion of each of the respective ballasting resistor structure of the plural parallel connected ballasting resistor structures.

9. The electronic circuit of claim 7, wherein each ballasting resistor structure comprises: a line of polysilicon material, a metal gate, or a metal silicide material.

10. The electronic circuit of claim 1, wherein the first conductive structure and second conductive structure connected to the ballasting resistor element limits a leakage current at each respective first FET device and second FET device under a stress voltage and temperature condition.

11. A method of fabricating an electronic circuit comprising:
   forming a drive stage inverter having first and a second field effect transistor (FET) devices, the first FET device of a first device polarity and the second FET device of second device polarity,
   forming a second stage device having a formed first FET device and a formed second FET device, each formed first FET device and a formed second FET device having a respective plurality of common input gate terminal structures;
   forming one or more ballasting resistor structures, each ballasting resistor structure connecting two or more common input gate terminals of the formed second stage first FET and the second FET devices, a ballasting resistor structure physically present within each of the two or more common input gate terminals of a connected second stage device;
   forming a first conductive structure that connects a first drive stage inverter FET output drive terminal of the first device polarity to one end of each of the one or more ballasting resistor structures; and
   forming a second conductive structure that connects a first drive stage inverter FET output drive terminal of the second device polarity to an opposite end of each of the one or more ballasting resistor structures;
   wherein the first conductive structure includes a first conducting path further connecting the first FET output drive terminal to the second FET output drive terminal through the ballasting resistor structures; and the second separate conductive structure includes a second conducting path, separate from the first conducting path, further connecting the second FET output drive terminal to the first FET output drive terminal through the ballasting resistor structures.

12. The method of claim 11, wherein each output drive terminal of the first FET device and second FET device is an FET device drain terminal.

13. The method of claim 12, wherein each of the formed first and second FET devices of the second stage device is a multi-fingered gate FET device having multiple parallel FET structures.

14. The method of claim 13, wherein the forming the first conductive structure further comprises:
forming conducting paths electrically connecting each output drive terminal of a respective parallel FET structure of the multi-fingered gate first FET device to the plurality of common input gate terminal structures of the second stage device at the one end of each the one or more ballasting resistor structures.

15. The method of claim 13, wherein the forming the second conductive structure further comprises:
forming conducting paths electrically connecting each output drive terminal of a respective parallel FET structure of the multi-fingered gate second FET device to the plurality of common input gate terminal structures of the second stage device at the opposite end of each of the one or more ballasting resistor structures.

16. The method of claim 11, wherein each the formed first and second FET devices forming the second stage device is a multi-fingered gate FET device having multiple parallel FET poly-silicon or metal gate structures.

17. The method of claim 16, wherein the second stage device is an inverter device.

18. The method of claim 16, further comprising:
segmenting parallel multiple gate fingers of the multi-fingered gate FET device into a plural of segments, each segment having a sub-set of the plurality of parallel connected multi-gate fingers, wherein a ballasting resistor corresponds to a corresponding segment sub-set of the plurality of parallel connected multi-gate fingers.

19. The method of claim 18, wherein the forming the first conductive structure includes forming conductive paths connecting the first FET output drive terminal to a respective first contact portion at each the one end of respective ballasting resistor structures, and the forming the second conductive structure includes forming conductive paths connecting the second FET output drive terminal to a respective second contact portion at each of the opposite end if the respective ballasting resistor structures.

20. An electronic circuit comprising:
a first stage device comprising a configuration of a voltage "pull-up" device segment and a voltage "pull-down" device segment; and
a second stage device having the first and second input gate terminals, the pull-up and pull-down device segments for driving the connected second stage device through a ballasting resistor element physically present within the first input and second input gate terminals of the connected second stage device;
the first pull-down device segment having an output drive terminal, and the second pull-up device segment having an output drive terminal; and
a first conductive structure for connecting the pull-down device segment output drive terminal to the first and second input terminals of the connected second stage device and including a first path further connecting the first pull-down device segment output drive terminal to the second pull-up device segment output drive terminal through the ballasting resistor element; and
a second conductive structure for connecting the second pull-up device segment output drive terminal to the first and second input terminals of the second stage device and including a second path, separate from the first path, further connecting the second pull-up device segment output drive terminal to the first pull-down device segment output drive terminal through the ballasting resistor element.

* * * * *